US009019028B2

(12) United States Patent
Lin et al.

(10) Patent No.: US 9,019,028 B2
(45) Date of Patent: Apr. 28, 2015

(54) INTEGRATED EPITAXIAL STRUCTURE FOR COMPOUND SEMICONDUCTOR DEVICES

(71) Applicant: WIN Semiconductors Corp., Kuei Shan Hsiang, Tao Yuan Shien (TW)

(72) Inventors: Cheng-Kuo Lin, Tao Yuan Shien (TW); Szu-Ju Li, Tao Yuan Shien (TW); Rong-Hao Syu, Tao Yuan Shien (TW); Shu-Hsiao Tsai, Tao Yuan Shien (TW)

(73) Assignee: WIN Semiconductors Corp., Kuei Shan Hsiang, Tao Yuan Shien (TW)

( * ) Notice: Subject to any disclaimer, the term of this patent is extended or adjusted under 35 U.S.C. 154(b) by 40 days.

(21) Appl. No.: 13/661,804

(22) Filed: Oct. 26, 2012

(65) Prior Publication Data
US 2013/0334570 A1 Dec. 19, 2013

(30) Foreign Application Priority Data

Jun. 13, 2012 (TW) .............................. 101121127 A

(51) Int. Cl.
*H01L 29/205* (2006.01)
*H01L 29/36* (2006.01)
*H01L 29/737* (2006.01)
*H01L 29/812* (2006.01)
*H01L 29/93* (2006.01)
*H01L 27/06* (2006.01)
H01L 29/20 (2006.01)

(52) U.S. Cl.
CPC .............. *H01L 29/205* (2013.01); *H01L 29/36* (2013.01); *H01L 29/7371* (2013.01); *H01L 29/812* (2013.01); *H01L 29/93* (2013.01); *H01L 29/20* (2013.01); *H01L 27/0605* (2013.01)

(58) Field of Classification Search
CPC ..... H01L 29/93; H01L 29/7371; H01L 29/36; H01L 29/812; H01L 29/205; H01L 29/0605; H01L 29/66242; H01L 29/66318; H01L 29/0623; H01L 29/06; H01L 29/737; H01L 29/66174; H01L 27/0623; H01L 27/0808; H03B 5/1243; H03B 2201/0208; H03B 2200/004; H03B 5/368; H03B 5/1231; H03J 2200/37; H03J 7/12
USPC ................... 331/177 V, 108 R; 257/E21.371, 257/E29.344, E21.364, 191, 197, 596, 257/E27.049, 312, E29.033, E21.695, 6; 438/379, 235

See application file for complete search history.

(56) References Cited

U.S. PATENT DOCUMENTS

| 5,132,764 | A  | * | 7/1992  | Bayraktaroglu | .............. | 257/198 |
| 5,789,801 | A  | * | 8/1998  | Stoneham | ...................... | 257/597 |
| 7,656,002 | B1 | * | 2/2010  | Barratt et al. | .................. | 257/474 |
| 2002/0011604 | A1 | * | 1/2002  | Yagura et al. | .................. | 257/194 |
| 2006/0208290 | A1 | * | 9/2006  | Feng et al. | ..................... | 257/292 |
| 2007/0278523 | A1 | * | 12/2007 | Lin et al. | ........................ | 257/194 |
| 2008/0042762 | A1 | * | 2/2008  | Yang et al. | ................. | 331/107 T |
| 2009/0101919 | A1 | * | 4/2009  | Yao | ................................ | 257/85 |

* cited by examiner

*Primary Examiner* — Peter Bradford
(74) *Attorney, Agent, or Firm* — Muncy, Geissler, Olds & Lowe, P.C.

(57) ABSTRACT

An integrated structure of compound semiconductor devices is disclosed. The integrated structure comprises from bottom to top a substrate, a first epitaxial layer, an etching-stop layer, a second epitaxial layer, a sub-collector layer, a collector layer, a base layer, and an emitter layer, in which the first epitaxial layer is a p-type doped layer, the second epitaxial layer is an n-type graded doping layer with a gradually increased or decreased doping concentration, and the sub-collector layer is an n-type doped layer. The integrated structure can be used to form an HBT, a varactor, or an MESFET.

9 Claims, 6 Drawing Sheets

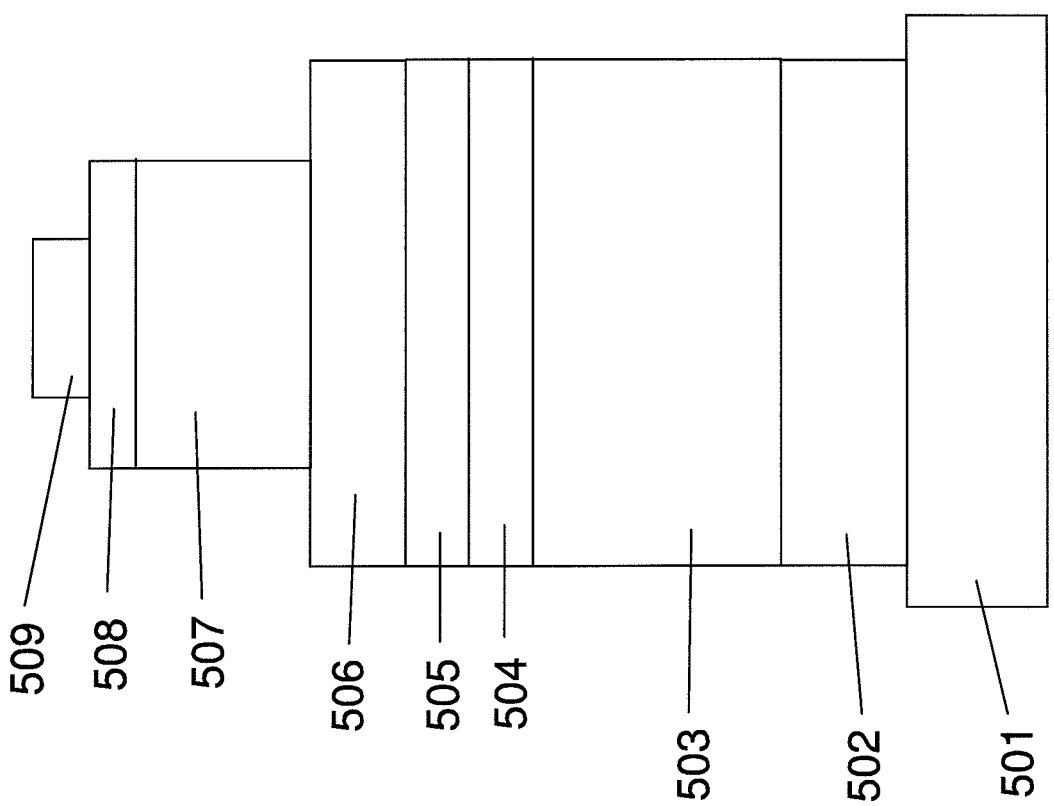

INTEGRATED EPITAXIAL STRUCTURE FOR COMPOUND SEMICONDUCTOR DEVICES

FIELD OF THE INVENTION

The present invention relates to an integrated structure of compound semiconductor devices, and in particular, to a structure that can integrate a heterojunction bipolar transistor (HBT), a varactor, and a metal semiconductor field effect transistor (MESFET) on the same wafer for applications in voltage-controlled oscillators (VCO) and power amplifiers (PA).

BACKGROUND OF THE INVENTION

A voltage-controlled oscillator (VCO) device consists of two components: an HBT and a varactor. A varactor is an electronic device whose capacitance can be varied by changing the applied voltage. They are applied mainly in various tuning circuits. In conventional compound semiconductor manufacturing processes, the base-collector junction of an HBT is usually utilized as a varactor. FIG. 1A is a schematic showing the cross-sectional view of a conventional varactor, consisting of a p-type doped layer 101, a first n-type doped layer 102, and a second n-type doped layer 103. Such a varactor structure can be formed by an HBT, in which the base layer (p-type), the collector layer (n-type), and the sub-collector layer (n-type) form respectively the p-type doped layer 101, the first n-type doped layer 102, and the second n-type doped layer 103. By this means, the fabrication processes for varactors are compatible with that for HBTs, which considerably simplifies the whole manufacturing process. In typical HBT devices, the n-type doping concentration in the collector layer is designed to have an increasing concentration from the base layer to the sub-collector layer. That is, the n-type doping concentration in the collector layer is lower near the base layer, as shown in FIG. 1A, such that the base-collector junction in an HBT can have a higher breakdown voltage and a lower leakage current. On the other hand, to produce a high capacitance ratio (C ratio) in a varactor, a large gradient in the doping concentration is essential. FIG. 1B shows a better design for a varactor, where a concentration gradient in the first n-type doped layer 102 with the highest concentration adjacent to the p-type doped layer 101 is introduced, by which a higher C ratio can be achieved. However, such a concentration gradient in the collector layer is detrimental for an HBT, since it will reduce the breakdown voltage and increase the leakage current. Therefore, a new epitaxial structure and fabrication process for monolithically integrated VCO devices are demanded.

In view of these facts and for overcoming the drawback stated above, the present invention provides an integrated structure of compound semiconductor devices, which includes optimized HBT and varactor.

SUMMARY OF THE INVENTION

The main object of the present invention is to provide an integrated structure of compound semiconductor devices, which includes an optimized HBT and an optimized varactor. The monolithically integrated structure is formed by inserting an n-type graded doping layer, an etching-stop layer, and a p-type doped layer below an HBT. The inserted layers together with the sub-collector layer of the HBT can be used to form a varactor, in which the doping concentration of the n-type graded doping layer is gradually increasing or decreasing from the p-type doped layer to the sub-collector layer of the HBT. Thus, the high breakdown voltage and the low leakage current of the HBT can be preserved while increasing the C ratio of the varactor. Besides, the integrated structure of compound semiconductor devices provided by the present invention can be used to form a metal semiconductor FET (MESFET). The present invention can integrate multiple electronic devices in a monolithic structure, and thereby improving the device integration, reducing the surface area of a chip, and lowering the production cost.

To reach the objects stated above, the present invention provides an integrated structure of compound semiconductor devices, which comprises sequentially from bottom to top a substrate, a first epitaxial layer, an etching-stop layer, a second epitaxial layer, a sub-collector layer, a collector layer, a base layer, and an emitter layer. The first epitaxial layer is a p-type doped layer. The etching-stop layer is an n-type doped layer. The second epitaxial layer is an n-type graded doping layer with a doping concentration gradually increased or decreased from bottom to top. The sub-collector layer, the collector layer, and the emitter layer are n-type doped layers and the base layer is a p-type doped layer.

In implementation, the first epitaxial layer, the etching-stop layer, the second epitaxial layer, and the sub-collector layer can be used to form a varactor or a MESFET; and the sub-collector layer, the collector layer, the base layer, and the emitter layer can be used to form an HBT.

The present invention further provides an integrated structure of compound semiconductor devices, which comprises sequentially from bottom to top a substrate, a first epitaxial layer, a second epitaxial layer, a third epitaxial layer, an etching-stop layer, a sub-collector layer, a collector layer, a base layer, and an emitter layer. The first epitaxial layer is a n-type doped layer. The second epitaxial layer is an n-type graded doping layer with a doping concentration gradually increased or decreased from bottom to top. The third epitaxial layer is an p-type doped layer.

In implementation, the first epitaxial layer, the second epitaxial layer, and the third epitaxial layer can be used to form a varactor; and the sub-collector layer, the collector layer, the base layer, and the emitter layer can be used to form an HBT.

In implementation, the second epitaxial layer can include plural n-type doped layers, each with a different doping concentration, and the doping concentrations of the plural n-type doped layers are increased or decreased from bottom to top.

In implementation, the second epitaxial layer can be made of GaAs.

In implementation, the doping concentrations of the second epitaxial layer is ranging from $1 \times 10^{15}$ cm$^{-3}$ to $1 \times 10^{22}$ cm$^{-3}$, and the thickness of the second epitaxial layer is between 10 Å to 1000 Å.

In implementation, the etching-stop layer is formed of InGaP.

In implementation, the substrate is formed of GaAs or InP.

For further understanding the characteristics and effects of the present invention, some preferred embodiments referred to drawings are in detail described as follows.

BRIEF DESCRIPTION OF DRAWINGS

FIG. 5 is a schematic showing the cross-sectional view of another embodiment of the integrated structure of compound semiconductor devices provided by the present invention.

DETAILED DESCRIPTIONS OF PREFERRED EMBODIMENTS

Figures 1A, 1B:
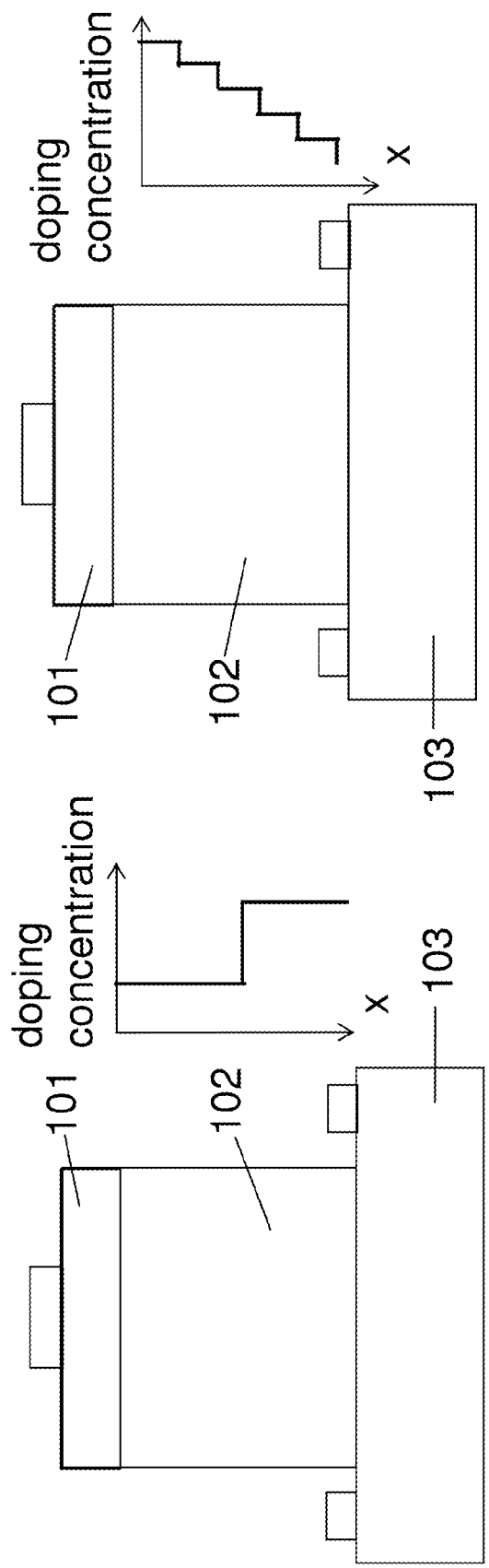
FIGS. 1A and 1B are schematics showing the cross-sectional view of the epitaxial structures of a varactor according to a previous technology and the present invention.
Figure 2:
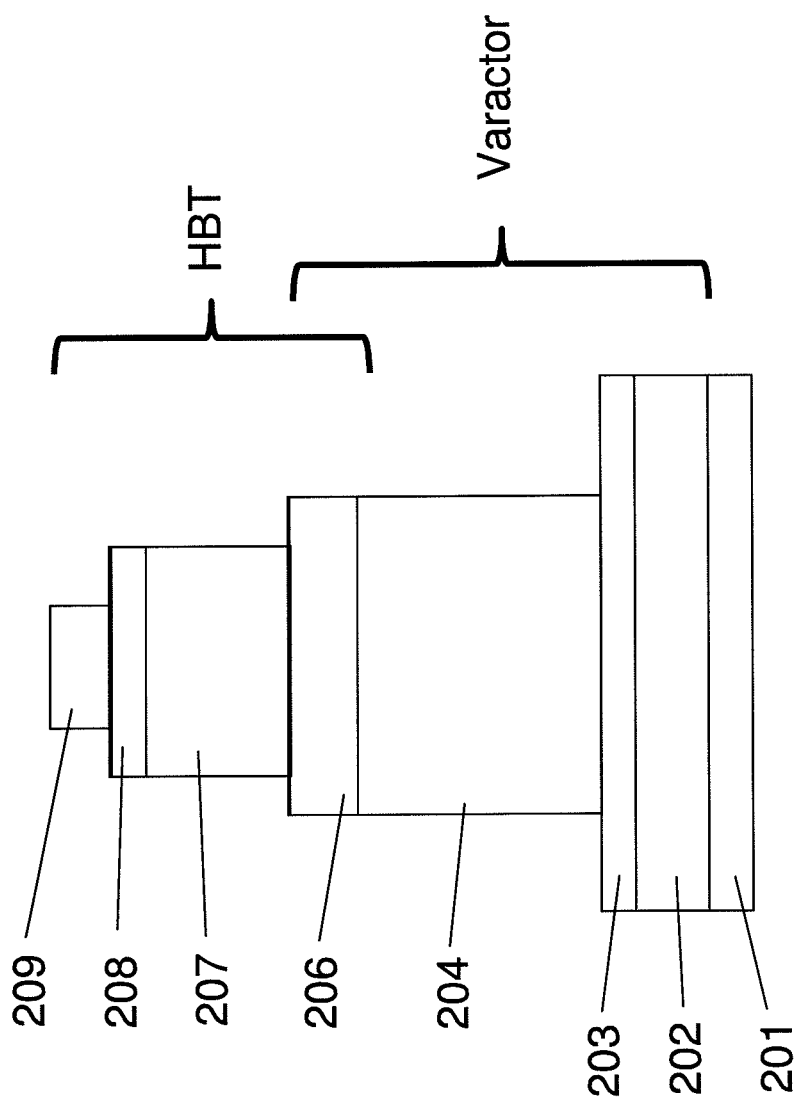
FIG. 2 is a schematic showing the cross-sectional view of an embodiment of the integrated structure of compound semiconductor devices provided by the present invention.

The integrated structure of compound semiconductor devices including an optimized HBT and an optimized varactor provided by the present invention is shown schematically in FIG. 2. The structure comprises a substrate 201, a first epitaxial layer 202, an etching-stop layer 203, a second epitaxial layer 204, a sub-collector layer 206, a collector layer 207, a base layer 208, and an emitter layer 209. The first epitaxial layer is a p-type doped layer.

In the structure stated above, the substrate 201 is made of a semi-insulating semiconductor material such as GaAs or InP. The first epitaxial layer 202 is a p-type doped layer formed on the substrate 201. The first epitaxial layer 202 is made preferably of GaAs. The thickness of the first epitaxial layer can be selected to be between 10 nm and 1000 nm, preferably between 10 nm and 100 nm. The doping concentration of the first epitaxial layer can be selected to be between $1\times10^{15}$ cm$^{-3}$ and $1\times10^{22}$ cm$^{-3}$, preferably between $1\times10^{18}$ cm$^{-3}$ and $1\times10^{22}$ cm$^{-3}$. The etching-stop layer 203 is an n-type doped layer formed on the first epitaxial layer 202. The etching-stop layer 203 is made preferably of InGaP. The thickness of the etching-stop layer can be selected to be between 10 nm and 1000 nm, preferably between 10 nm and 50 nm. The doping concentration of the etching-stop layer can be selected to be between $1\times10^{15}$ cm$^{-3}$ and $1\times10^{22}$ cm$^{-3}$, preferably between $1\times10^{17}$ cm$^{-3}$ and $1\times10^{18}$ cm$^{-3}$. The second epitaxial layer 204 is an n-type graded doping layer formed on the etching-stop layer 203. The second epitaxial layer 204 is made preferably of GaAs. The thickness of the second epitaxial layer can be selected to be between 10 nm and 1000 nm. The doping concentration of the second epitaxial layer can be selected to be gradually increased or decreased from bottom to top, preferably decreased. The doping concentration of the second epitaxial layer can be selected to be between $1\times10^{15}$ cm$^{-3}$ and $1\times10^{22}$ cm$^{-3}$, preferably between $1\times10^{16}$ cm$^{-3}$ and $1\times10^{18}$ cm$^{-3}$. The second epitaxial layer 204 can further include plural n-type doped layers, each of which have a different doping concentration, and the doping concentrations of the plural n-type doped layers can be selected to increase or decrease from bottom to top, preferably decrease. The sub-collector layer 206 is an n-type doped layer formed on the second epitaxial layer 204. The doping concentration of the sub-collector layer can be selected to be between $1\times10^{15}$ cm$^{-3}$ and $1\times10^{22}$ cm$^{-3}$, preferably between $1\times10^{18}$ cm$^{-3}$ and $1\times10^{22}$ cm$^{-3}$. The collector layer 207 is an n-type doped layer formed on the sub-collector layer 206. The base layer 208 is a p-type doped layer formed on the collector layer 207. The emitter layer 209 is an n-type doped layer formed on the base layer 208.

Figure 3:
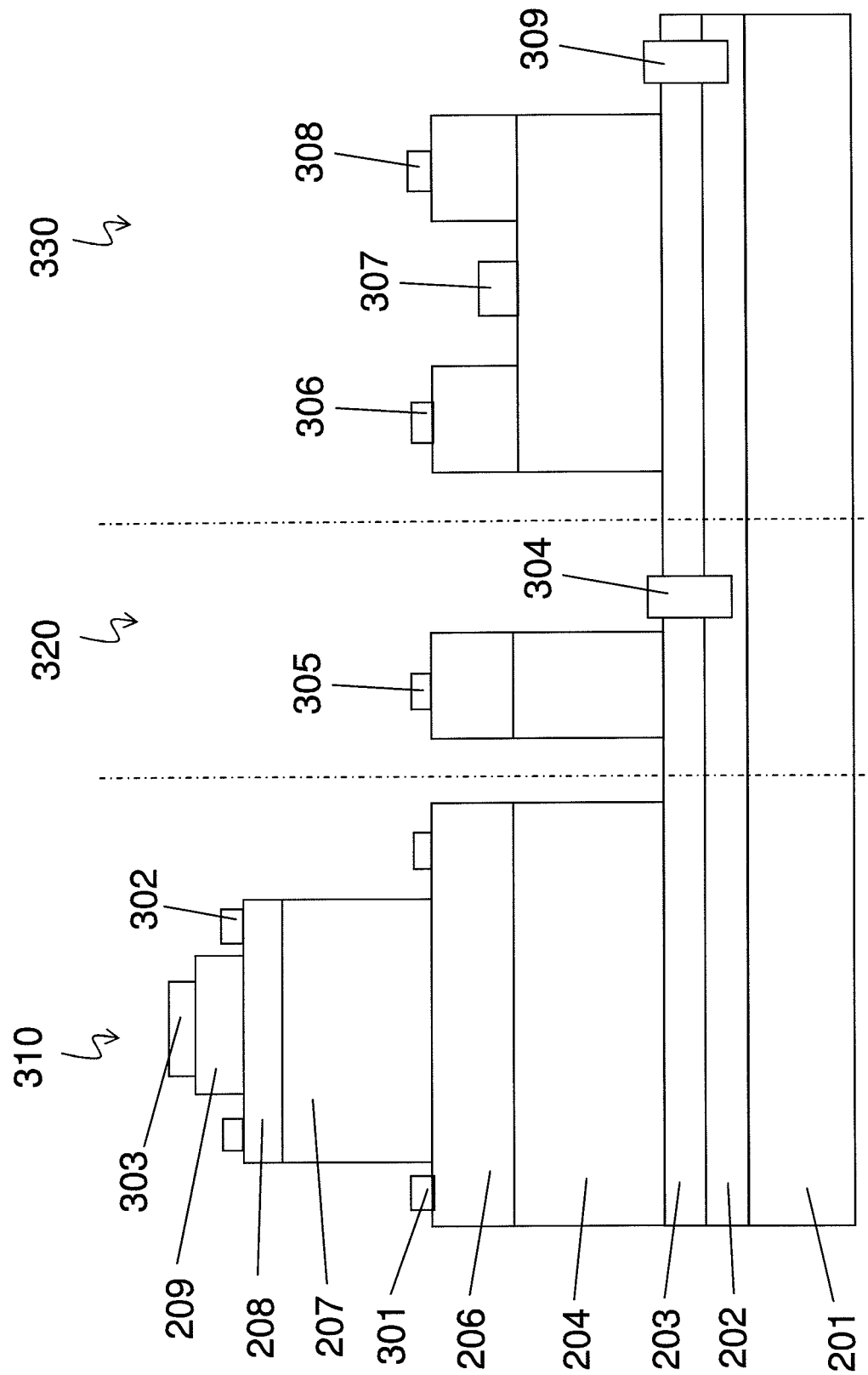
FIG. 3 is a schematic showing the cross-sectional view of an embodiment of semiconductor devices formed by using the integrated structure of compound semiconductor devices provided by the present invention.

For the fabrication of semiconductor devices using the monolithically integrated structure described above, as shown in FIG. 3, a collector electrode 301 can be disposed on the sub-collector layer 206, a base electrode 302 can be disposed on the base layer 208, and an emitter electrode 303 can be disposed on the emitter layer 209. The sub-collector layer 206, the collector layer 207, the base layer 208, the emitter layer 209, the collector electrode 301, the base electrode 302, and the emitter electrode 303 can then form an HBT 310. An anode 304 can be disposed on the etching-stop layer 203, and then by using thermal annealing process, the metal atoms of the anode 304 can diffuse to the first epitaxial layer 202 and form ohmic contact. A cathode 305 can be disposed on the sub-collector layer 206. The first epitaxial layer 202, the etching-stop layer 203, the second epitaxial layer 204, the sub-collector layer 206, the anode 304, and the cathode 305 can then form a varactor 320. Besides, a gate recess can be formed on the second epitaxial layer 204 by etching away the sub-collector layer 206. The regions at the two sides of the gate recess on the sub-collector layer 206 form a source and a drain regions, respectively. By disposing a gate electrode 307 on the second epitaxial layer 204 in the gate recess, a source electrode 306 and a drain electrode 308 on the sub-collector layer 206 at the two sides of the gate recess, and a base electrode 309 on the first epitaxial layer 202 penetrating the etching-stop layer 203, then the first epitaxial layer 202, the etching-stop layer 203, the second epitaxial layer 204, the sub-collector layer 206, the source electrode 306, the gate electrode 307, the drain electrode 308, and the base electrode 309 can form a MESFET 330. Therefore, the integrated structure of compound semiconductor devices provided by the present invention can be used to form various electronic devices such as an HBT, a varactor, and a MESFET.

Table 1 shows an embodiment of the epitaxial layers of a varactor according to the present invention. In the embodiment, the second epitaxial layer 204 is designed to have a hyper-abrupt doping profile to increase the capacitance ratio (C ratio) of the varactor. The doping concentration of the anode side of the varactor, i.e., the first epitaxial layer 202 (p-type doped), is selected to be higher than $1\times10^{19}$ cm$^{-3}$, and the doping concentration of the cathode side of the varactor, i.e., the sub-collector layer 206 (n-type doped), is selected to be higher than $1\times10^{18}$ cm$^{-3}$. The doping concentration of the epitaxial layer in between, i.e., the second epitaxial layer 204, is selected to be between $1\times10^{16}$ cm$^{-3}$ and $1\times10^{18}$ cm$^{-3}$. The hyper-abrupt doping profile is implemented by dividing the second epitaxial layer 204 with the thickness of 400 nm into 8 layers, each with the thickness of 50 nm, and the doping concentrations of the 8 layers are increased non-linearly from top to bottom as shown in Table 1.

Figure 4B:
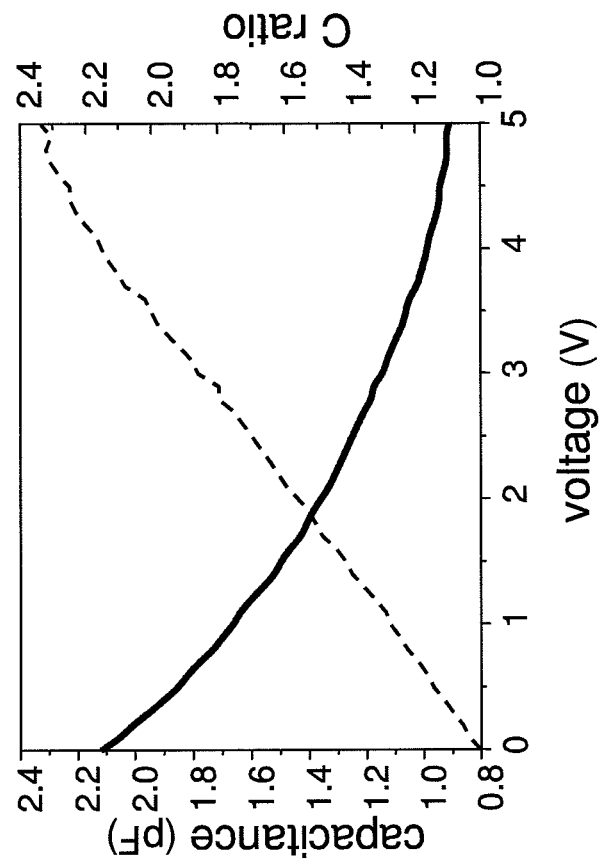
FIGS. 4A and 4B are diagrams showing the capacitance between the base and the collector electrodes ($C_{bc}$) of a varactor to the applied voltage ($V_a$) and the corresponding C ratio according to a previous technology and the present invention.
Figure 4A:
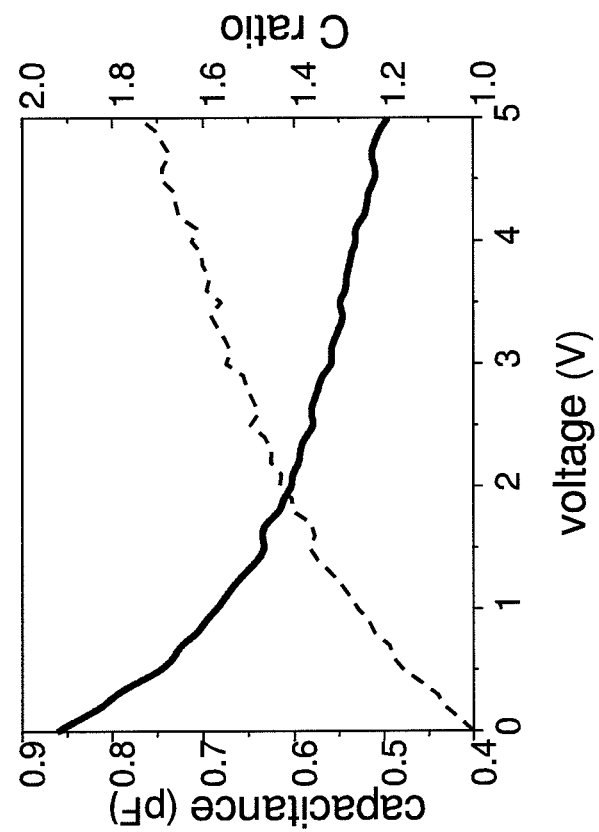

FIGS. 4A and 4B are diagrams showing the base-collector capacitance ($C_{bc}$) of a varactor (solid line) and the corresponding C ratio (dashed line) as a function of the applied voltage (V) according to a previous technology and the present invention, respectively. The C ratio is calculated by $C_x/C_{max}$, where $C_x$ is the capacitance measured under the applied voltage x, and $C_{max}$ is the capacitance measured under the maximum applied voltage. In the embodiment, the maximum applied voltage is 5V. The figures show that the largest C ratio, i.e., $C_{0V}/C_{5V}$, is about 1.7 in a previous technology, whereas the largest C ratio, i.e., $C_{0V}/C_{5V}$, is increased to about 2.3 in the embodiment of the present invention.

To further increase the C ratio and the Q value of a varactor, the present invention provides another integrated structure of compound semiconductor devices, as shown by the schematic in FIG. 5. The structure comprises a substrate 501, a first epitaxial layer 502, a second epitaxial layer 503, a third epitaxial layer 504, an etching-stop layer 505, a sub-collector layer 506, a collector layer 507, a base layer 508, and an emitter layer 509.

In the structure stated above, the substrate 501 is made of a semi-insulating semiconductor material such as GaAs or InP. The first epitaxial layer 502 is an n-type doped layer formed on the substrate 501. The thickness of the first epitaxial layer can be selected to be between 10 nm and 1000 nm, preferably between 10 nm and 100 nm. The doping concentration of the first epitaxial layer can be selected to be between $1 \times 10^{15}$ cm$^{-3}$ and $1 \times 10^{22}$ cm$^{-3}$, preferably between $1 \times 10^{18}$ cm$^{-3}$ and $1 \times 10^{22}$ cm$^{-3}$. The second epitaxial layer 503 is an n-type graded doping layer formed on the first epitaxial layer 502. The second epitaxial layer 503 is made preferably of GaAs. The thickness of the second epitaxial layer can be selected to be between 10 nm and 1000 nm. The doping concentration of the second epitaxial layer can be selected to increase or decrease gradually from bottom to top, preferably increased. The doping concentration of the second epitaxial layer can be selected to be between $1 \times 10^{15}$ cm$^{-3}$ and $1 \times 10^{22}$ cm$^{-3}$, preferably between $1 \times 10^{16}$ cm$^{-3}$ and $1 \times 10^{18}$ cm$^{-3}$. The second epitaxial layer 503 can further include plural n-type doped layers, each of which have a different doping concentration, and the doping concentrations of the plural n-type doped layers can be selected to increase or decrease from bottom to top, preferably increase. The third epitaxial layer 504 is a p-type doped layer formed on the second epitaxial layer 503. The thickness of the third epitaxial layer can be selected to be between 10 nm and 1000 nm, preferably between 50 nm and 200 nm. The doping concentration of the third epitaxial layer can be selected to be between $1 \times 10^{15}$ cm$^{-3}$ and $1 \times 10^{22}$ cm$^{-3}$, preferably between $1 \times 10^{18}$ cm$^{-3}$ and $1 \times 10^{22}$ cm$^{-3}$. The etching-stop layer 505 is formed on the third epitaxial layer 504. The etching-stop layer 505 is made preferably of InGaP. The sub-collector layer 506 is an n-type doped layer formed on the etching-stop layer 505. The collector layer 507 is an n-type doped layer formed on the sub-collector layer 506. The base layer 508 is a p-type doped layer formed on the collector layer 507. The emitter layer 509 is an n-type doped layer formed on the base layer 508.

Figure 6:
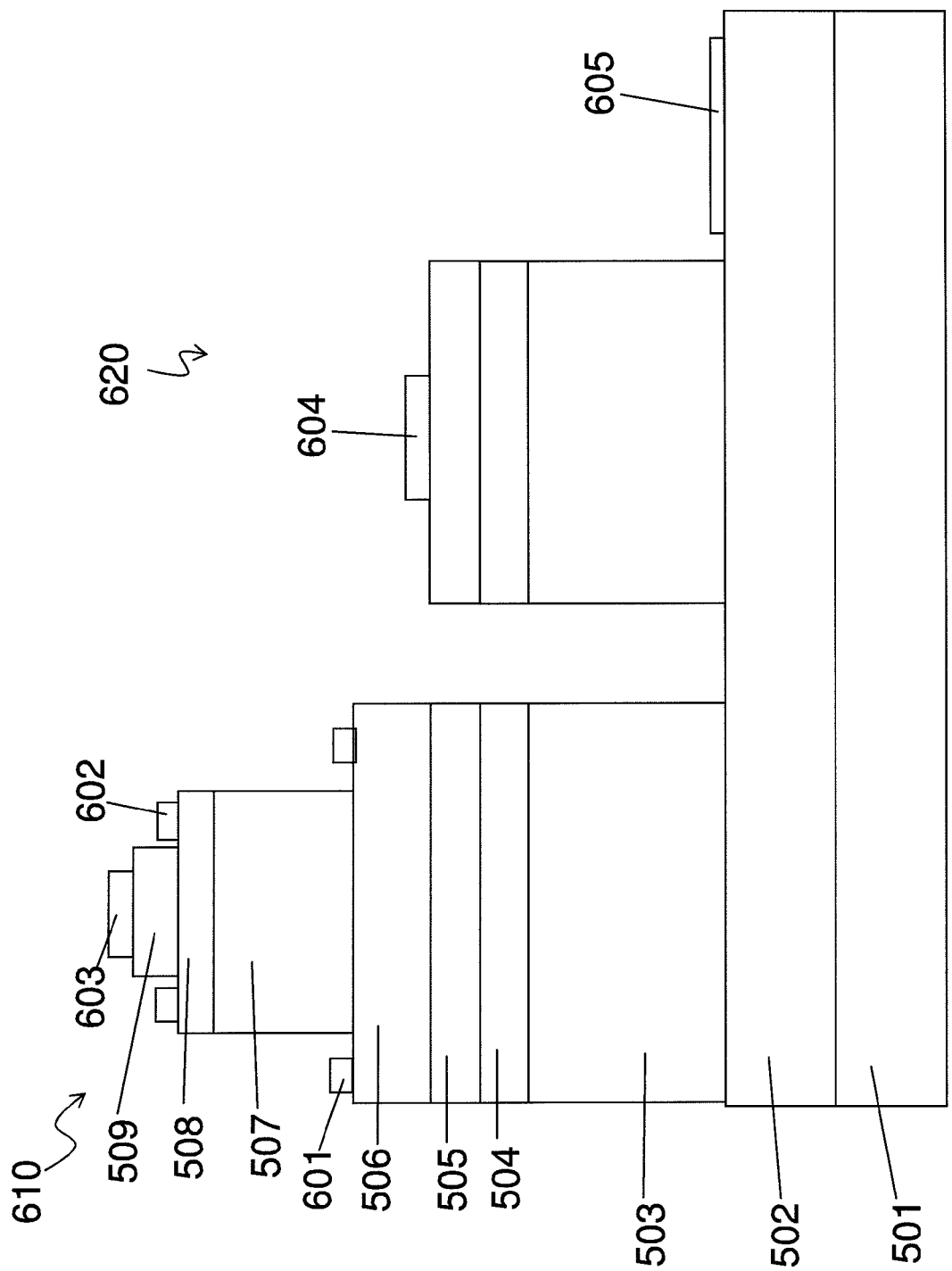
FIG. 6 is a schematic showing the cross-sectional view of another embodiment of semiconductor devices formed by using the integrated structure of compound semiconductor devices provided by the present invention.

For the fabrication of semiconductor devices using the monolithically integrated structure described above, as shown in FIG. 6, a collector electrode 601 can be disposed on the sub-collector layer 506, a base electrode 602 can be disposed on the base layer 508, and an emitter electrode 603 can be disposed on the emitter layer 509. The sub-collector layer 506, the collector layer 507, the base layer 508, the emitter layer 509, the collector electrode 601, the base electrode 602, and the emitter electrode 603 can then form an HBT 610. An anode 604 can be disposed on the etching-stop layer 505. By using thermal annealing process, the metal atoms of the anode 604 can diffuse to the third epitaxial layer 504 and form ohmic contact. A cathode 605 can be disposed on the first epitaxial layer 502. The first epitaxial layer 502, the second epitaxial layer 503, the third epitaxial layer 504, the anode 604, and the cathode 605 can then form a varactor 620. Therefore, the integrated structure of compound semiconductor devices provided by the present invention can be used to form various electronic devices such as an HBT, and a varactor.

The second epitaxial layer 503 of the structure described above can be designed to have a hyper-abrupt doping profile to increase the C ratio of the varactor. The doping concentration of the anode side of the varactor, i.e., the third epitaxial layer 504, is selected to be higher than $1 \times 10^{19}$ cm$^{-3}$, and the doping concentration of the cathode side of the varactor, i.e., the first epitaxial layer 502, is selected to be higher than $1 \times 10^{18}$ cm$^{-3}$. The doping concentration of the epitaxial layer in between, i.e., the second epitaxial layer 503, is selected to be between $1 \times 10^{16}$ cm$^{-3}$ and $1 \times 10^{18}$ cm$^{-3}$, and the doping concentration is increased non-linearly from bottom to top.

To sum up, the present invention can indeed get its anticipated object to provide an integrated structure of compound semiconductor devices, which can integrate the epitaxial structure of an HBT, a varactor, and a MESFET into a single monolithic structure. The HBT and varactor provided by structure can be optimized separately. Thus, present invention can provide an HBT with high breakdown voltage and low leakage current and a varactor with high C ratio. The present invention can integrate multiple electronic devices in a monolithic structure, and hence the device integration can be improved, the surface area of a chip can be reduced, and the production cost can thus be decreased.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

TABLE 1

| Epitaxial layer type | Material | Thickness (nm) | Doping concentration (cm$^{-3}$) |
|---|---|---|---|
| n sub-collector | GaAs | 600 | $5.0 \times 10^{18}$ |
| n-type (8) | GaAs | 50 | $1.9 \times 10^{16}$ |
| n-type (7) | GaAs | 50 | $2.3 \times 10^{16}$ |
| n-type (6) | GaAs | 50 | $2.9 \times 10^{16}$ |
| n-type (5) | GaAs | 50 | $3.8 \times 10^{16}$ |
| n-type (4) | GaAs | 50 | $5.3 \times 10^{16}$ |
| n-type (3) | GaAs | 50 | $8.2 \times 10^{16}$ |
| n-type (2) | GaAs | 50 | $1.5 \times 10^{17}$ |
| n-type (1) | GaAs | 50 | $2.8 \times 10^{17}$ |
| etching-stop | In$_x$Ga$_{1-x}$P | 20 | $2.8 \times 10^{17}$ |
| first epitaxial | GaAs | 60 | $4.0 \times 10^{19}$ |

The invention claimed is:

1. A integrated structure of compound semiconductor devices, sequentially comprising:
   a substrate;
   a first epitaxial layer made of an n-type doped layer formed on said substrate;
   a second epitaxial layer made of an n-type graded doping layer formed on said first epitaxial layer with a doping concentration gradually increased or decreased from bottom to top;
   a third epitaxial layer made of a p-type doped layer formed on said second epitaxial layer;
   an etching-stop layer formed on said third epitaxial layer;
   a sub-collector layer formed on said etching-stop layer,
   a collector layer formed on said sub-collector layer,
   a base layer formed on said collector layer, and
   an emitter layer formed on said base layer.

2. The integrated structure of compound semiconductor devices according to claim 1, wherein said first epitaxial layer, said second epitaxial layer, and third epitaxial layer form the epitaxial structure of a varactor; said sub-collector layer, said collector layer, said base layer, and said emitter layer form the epitaxial structure of an HBT.

3. The integrated structure of compound semiconductor devices according to claim 1, wherein said second epitaxial layer includes plural n-type doped layers, each with a different doping concentration, and the doping concentrations of said plural n-type doped layers are increased or decreased from the bottom layer to the top layer.

4. The integrated structure of compound semiconductor devices according to claim 3, wherein said second epitaxial layer is made of GaAs.

5. The integrated structure of compound semiconductor devices according to claim 3, wherein the doping concentrations of said second epitaxial layer are larger than or equal to $1\times10^{15}$ cm$^{-3}$ and smaller than or equal to $1\times10^{22}$ cm$^{-3}$, and the thickness of said second epitaxial layer is between 10 Å and 1000 Å.

6. The integrated structure of compound semiconductor devices according to claim 1, wherein said second epitaxial layer is made of GaAs.

7. The integrated structure of compound semiconductor devices according to claim 1, wherein the doping concentrations of said second epitaxial layer are larger than or equal to $1\times10^{15}$ cm$^{-3}$ and smaller than or equal to $1\times10^{22}$ cm$^{-3}$, and the thickness of said second epitaxial layer is between 10 Å and 1000 Å.

8. The integrated structure of compound semiconductor devices according to claim 1, wherein said etching-stop layer is formed of InGaP.

9. The integrated structure of compound semiconductor devices according to claim 1, wherein said substrate is formed of GaAs or InP.

* * * * *